(12) United States Patent
Bae et al.

(10) Patent No.: US 8,902,088 B2
(45) Date of Patent: Dec. 2, 2014

(54) MINIMUM ENERGY CODING METHOD AND APPARATUS FOR PERFORMING DIRECT CURRENT (DC) BALANCING IN BODY AREA NETWORK OR LOW POWER NETWORK

(71) Applicant: Samsung Electronics Co., Ltd., Suwon-si (KR)

(72) Inventors: Chi Sung Bae, Yongin-si (KR); Hyo Sun Hwang, Seoul (KR); Young Jun Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/975,636

(22) Filed: Aug. 26, 2013

(65) Prior Publication Data
US 2014/0077976 A1    Mar. 20, 2014

(30) Foreign Application Priority Data

Sep. 18, 2012    (KR) .................. 10-2012-0103379

(51) Int. Cl.
*H03M 5/14*    (2006.01)
*H03M 7/14*    (2006.01)
*H03M 7/20*    (2006.01)

(52) U.S. Cl.
CPC ............. *H03M 7/14* (2013.01); *H03M 5/145* (2013.01); *H03M 7/20* (2013.01)
USPC .......................................... 341/58

(58) Field of Classification Search
CPC ...................................... H03M 5/145
USPC ................... 341/58, 59; 375/253, 254
See application file for complete search history.

(56) References Cited

U.S. PATENT DOCUMENTS

| | | | |
|---|---|---|---|
| 5,200,979 A * | 4/1993 | Harris ........................... | 375/292 |
| 5,625,644 A | 4/1997 | Myers | |
| 6,553,535 B1 * | 4/2003 | Asada et al. .................. | 714/777 |
| 7,039,121 B2 * | 5/2006 | Shin et al. ..................... | 375/292 |
| 7,199,728 B2 | 4/2007 | Dally et al. | |
| 7,460,035 B1 * | 12/2008 | Ho et al. ......................... | 341/58 |
| 7,522,073 B1 * | 4/2009 | Kao ................ | 341/55 |
| 2009/0034660 A1 | 2/2009 | May et al. | |
| 2010/0259426 A1 * | 10/2010 | Bae et al. ....................... | 341/58 |

FOREIGN PATENT DOCUMENTS

| | | |
|---|---|---|
| JP | 2001-125785 | 5/2001 |
| JP | 3589648 | 8/2004 |
| KR | 10-2007-0048529 | 5/2007 |
| KR | 10-0877680 | 1/2009 |
| WO | WO 0191306 A1 * | 11/2001 |

OTHER PUBLICATIONS

Liu et al., An Ultra Low Power Baseband Transceiver IC for Wireless Body Area Network in 0.18-micrometer CMOS Technology, Aug. 2011, IEEE Transactions on Very Large Scale Integration (VLSI) Systems, vol. 19, No. 8.*

(Continued)

*Primary Examiner* — Howard Williams
(74) *Attorney, Agent, or Firm* — NSIP Law

(57) ABSTRACT

A minimum energy coding method and apparatus that includes obtaining groups of bits from a bitstream and finding a mapping rule between the groups of bits and codewords that is chosen to maintain a DC balance. For example, the bitstream may be a bitstream corresponding to a biosignal.

20 Claims, 10 Drawing Sheets

| MAPPING RULE 1 ⇒ | GROUP OF SOURCE BITSTREAM | RANKING OF APPEARANCE FREQUENCY | CODEWORD |
|---|---|---|---|
| | $S_0$ | 1 | $M_0$ |
| | $S_1$ | 2 | $M_1$ |
| | $S_2$ | 3 | $M_2$ |
| | $S_3$ | 4 | $M_3$ |
| | $S_4$ | 5 | $M_4$ |

| MAPPING RULE 2 ⇒ | GROUP OF SOURCE BITSTREAM | RANKING OF APPEARANCE FREQUENCY | CODEWORD |
|---|---|---|---|
| | $S_0$ | 5 | $M_1$ |
| | $S_1$ | 2 | $M_4$ |
| | $S_2$ | 4 | $M_3$ |
| | $S_3$ | 3 | $M_2$ |
| | $S_4$ | 1 | $M_0$ |

| MAPPING RULE 3 ⇒ | GROUP OF SOURCE BITSTREAM | RANKING OF APPEARANCE FREQUENCY | CODEWORD |
|---|---|---|---|
| | $S_0$ | 3 | $M_4$ |
| | $S_1$ | 4 | $M_3$ |
| | $S_2$ | 1 | $M_0$ |
| | $S_3$ | 5 | $M_2$ |
| | $S_4$ | 2 | $M_1$ |

(56) References Cited

OTHER PUBLICATIONS

Y. Prakash et al. "Energy Efficient Source Coding and Modulation for Wireless Applications" Wireless Communications and Networking, IEEE vol. 1. (Mar. 2003): pp. 212-217.

Qinghui Tang et al. "BER Performance Analysis of an On-off Keying based Minimum Energy Coding for Energy Constrained Wireless Sensor Application." Communications, ICC 2005 IEEE International Conference on. vol. 4. (May 2005) pp. 2734-2738.

Chun-Hung Liu and H. Harry Asada "A Source Coding and Modulation Method for Power Saving and Interference Reduction in DS-CDMA Sensor Network Systems." American Control Conference 2002, Proceedings of the 2002 vol. 4. IEEE (May 2002) pp. 3003-3008.

Fischione, Carlo et al. "Minimum Energy Coding in CDMA Wireless Sensor Networks." Wireless Communications, IEEE Transactions on 8.2 (Feb. 2009) pp. 985-994.

\* cited by examiner

FIG. 2

|  | ← K BIT → |  |  |  |  |
|---|---|---|---|---|---|
| $S_0$ | 00...00 | MAPPING → | $M_0$ | 0000...000 | ↑ n+1 ↓ |
| $S_1$ | 00...01 |  | $M_1$ | 0000...001 |  |
| ... | ... |  | ... | ... |  |
| $S_{n-1}$ | 11...10 |  | $M_{n-1}$ | 0100...000 |  |
| $S_n$ | 11...11 |  | $M_n$ | 1000...000 |  |

FIG. 3

| MAPPING RULE 1 ⇒ | GROUP OF SOURCE BITSTREAM | RANKING OF APPEARANCE FREQUENCY | CODEWORD |
|---|---|---|---|
| | $S_0$ | 1 | $M_0$ |
| | $S_1$ | 2 | $M_1$ |
| | $S_2$ | 3 | $M_2$ |
| | $S_3$ | 4 | $M_3$ |
| | $S_4$ | 5 | $M_4$ |

| MAPPING RULE 2 ⇒ | GROUP OF SOURCE BITSTREAM | RANKING OF APPEARANCE FREQUENCY | CODEWORD |
|---|---|---|---|
| | $S_0$ | 5 | $M_1$ |
| | $S_1$ | 2 | $M_4$ |
| | $S_2$ | 4 | $M_3$ |
| | $S_3$ | 3 | $M_2$ |
| | $S_4$ | 1 | $M_0$ |

| MAPPING RULE 3 ⇒ | GROUP OF SOURCE BITSTREAM | RANKING OF APPEARANCE FREQUENCY | CODEWORD |
|---|---|---|---|
| | $S_0$ | 3 | $M_4$ |
| | $S_1$ | 4 | $M_3$ |
| | $S_2$ | 1 | $M_0$ |
| | $S_3$ | 5 | $M_2$ |
| | $S_4$ | 2 | $M_1$ |

| SOURCE | FREQ | S CODE | ME4 | ME5 | ME6 | ME7 | ME8 |
|---|---|---|---|---|---|---|---|
| 8 | 1000 | 201 | 1000 | 0000 | 00000 | 000000 | 0000000 | 00000000 |
| 7 | 0111 | 93 | 0111 | 0001 | 00001 | 000001 | 0000001 | 00000001 |
| 2 | 0010 | 65 | 0010 | 0010 | 00010 | 000010 | 0000010 | 00000010 |
| 1 | 0001 | 48 | 0001 | 0100 | 00100 | 000100 | 0000100 | 00000100 |
| 14 | 1110 | 45 | 1110 | 1000 | 01000 | 001000 | 0001000 | 00001000 |
| 3 | 0011 | 40 | 0011 | 0011 | 10000 | 010000 | 0010000 | 00010000 |
| 9 | 1001 | 39 | 1001 | 0101 | 00011 | 100000 | 0100000 | 00100000 |
| 11 | 1011 | 37 | 1011 | 1001 | 00101 | 000011 | 1000000 | 01000000 |
| 4 | 0100 | 36 | 0100 | 0110 | 01001 | 000101 | 0000011 | 10000000 |
| 15 | 1111 | 29 | 1111 | 1010 | 10001 | 001001 | 0000101 | 00000011 |
| 6 | 0110 | 27 | 0110 | 1100 | 00110 | 010001 | 0001001 | 00000101 |
| 0 | 0000 | 25 | 0000 | 0111 | 01010 | 100001 | 0010001 | 00001001 |
| 10 | 1010 | 24 | 1010 | 1011 | 10010 | 000110 | 0100001 | 00010001 |
| 5 | 0101 | 20 | 0101 | 1101 | 01100 | 001010 | 1000001 | 00100001 |
| 12 | 1100 | 20 | 1100 | 1110 | 10100 | 010010 | 0000110 | 01000001 |
| 13 | 1101 | 19 | 1101 | 1111 | 11000 | 100010 | 0001010 | 10000001 |
| NUM OF 1 | | 1453 | 1101 | 843 | 804 | 767 | 731 |
| DATA RATE | | 1 | 1 | 0.8 | 0.667 | 0.571 | 0.5 |

MINIMUM ENERGY CODING METHOD AND APPARATUS FOR PERFORMING DIRECT CURRENT (DC) BALANCING IN BODY AREA NETWORK OR LOW POWER NETWORK

CROSS-REFERENCE TO RELATED APPLICATION

This application claims the benefit under 35 USC 119(a) of Korean Patent Application No. 10-2012-0103379 filed on Sep. 18, 2012, in the Korean Intellectual Property Office, the entire disclosure of which is incorporated herein by reference for all purposes.

BACKGROUND

1. Field

The following description relates to a method and apparatus for performing minimum energy coding when performing direct current (DC) balancing in a body area network or a low power network.

2. Description of Related Art

A topic of recent research is the use of a wireless network for sensing a biosignal of a patient or a user, and recording the sensed biosignal.

The wireless network may include elements such as a sensor configured to sense a biosignal of a patient or a user, a master node configured to receive data from the sensor and/or transmit a control signal with respect to the sensor, a server configured to manage biosignals gathered from a plurality of sensors, and an expert terminal configured to connect to the server and analyze the biosignal of the user or the patient technically, for example. Here, the master node may also refer to a mobile terminal.

The sensing devices to be used in such a network may require a design that consumes a low amount of power.

SUMMARY

In one general aspect, there is provided a method for performing minimum energy coding, including obtaining groups of bits from a source bitstream, determining a mapping rule between the groups of bits and corresponding codewords to maintain a direct current (DC) balance of the codewords to be mapped, and mapping the groups of bits to the codewords determined by the mapping rule.

In an embodiment, the determining of the mapping rule includes determining the mapping rule by reordering the codewords to be mapped, sequentially or recursively.

In an embodiment, the method further includes minimizing the transmission energy required to transmit the groups of bits while maintaining the DC balance of the codewords to be mapped through the mapping rule.

In an embodiment, the determining of the mapping rule includes selecting from mapping rules a mapping rule that maintains the DC balance of the codewords to be mapped as an optimal mapping rule.

In an embodiment, the determining of the mapping rule includes changing the mapping rule from a first mapping rule determined to be the mapping rule in a first time interval to a second mapping rule distinguished from the first mapping rule in a second time interval.

In an embodiment, the determining of the mapping rule includes predicting frequencies of groups of bits in the source bitstream corresponding to the codewords to be mapped, and calculating a DC balance corresponding to the codewords to be mapped, based on the predicted frequencies.

In an embodiment, the obtaining of the groups of bits from the source bitstream includes obtaining groups of bits from the source bitstream, each group of bits comprising a predetermined size.

In an embodiment, the method further includes generating an indicator for indicating the mapping rule, and transmitting the indicator to a master node.

In an embodiment, the method further includes transmitting the mapped codewords to a master node.

In another general aspect, there is provided a method for low power communication in a biosignal network, including sensing a biosignal, using a sensor, obtaining groups of bits from a source bitstream corresponding to the biosignal, determining a mapping rule between the groups of bits and corresponding codewords to maintain a DC balance of the codewords to be mapped, mapping the groups to the codewords determined by the mapping rule, and transmitting the mapped codewords to a master node.

In another general aspect, there is provided a non-transitory computer-readable medium comprising a program for instructing a computer to perform the method for performing minimum energy coding, discussed above.

In another general aspect, there is provided an apparatus for performing minimum energy coding, including a mapping rule determiner configured to determine a mapping rule between groups of bits obtained from a source bitstream and corresponding codewords to maintain a direct current (DC) balance of the codewords to be mapped, and a mapping unit configured to map the groups of bits to the codewords determined by the mapping rule.

In an embodiment, the mapping rule determiner is configured to determine the mapping rule by reordering the codewords to be mapped, sequentially or recursively.

In an embodiment, the mapping rule determiner minimizes the transmission energy required to transmit the groups of bits while maintaining the DC balance of the codewords to be mapped.

In an embodiment, the mapping rule determiner is configured to select from mapping rules a mapping rule that maintains the DC balance of the codewords to be mapped as an optimal mapping rule.

In an embodiment, the mapping rule determiner is configured to change a first mapping rule determined to be the mapping rule in a first time interval to a second mapping rule distinguished from the first mapping rule in a second time interval.

In an embodiment, the apparatus further includes a sensor configured to sense a biosignal and generate a source bitstream corresponding to the biosignal.

In an embodiment, the apparatus further includes a mapping rule indicator generator configured to generate an indicator for indicating the mapping rule and a communicator configured to transmit the indicator and the mapped codewords to a master node.

In another general aspect, there is provided an apparatus for performing minimum energy coding while maintaining a direct current (DC) balance, including a sensor configured to receive a biosignal, the biosignal corresponding to a bitstream, and a mapping rule determiner configured to obtain groups of bits from the bitstream, and determine an optimal mapping rule corresponding to a energy coding scheme for the groups of bits, wherein the energy coding scheme is chosen to minimize energy requirements while choosing codewords that satisfy requirements for the DC balance.

In an embodiment, the apparatus further includes a mapping rule indicator generator configured to generate an indicator for indicating the optimal mapping rule.

In an embodiment, the apparatus further includes a communicator configured to transmit the indicator and the mapped codewords to a master node.

In an embodiment, the mapping rule determiner determines the optimal mapping rule by reordering the codewords to be mapped, sequentially or recursively, until the codeword ordering minimizes the transmission energy required to transmit the groups of bits while maintaining a DC balance of the codewords to be mapped.

Other features and aspects will be apparent from the following detailed description, the drawings, and the claims.

BRIEF DESCRIPTION OF THE DRAWINGS

FIG. 2 is a diagram illustrating an example of a minimum energy coding scheme.

FIG. 3 is a diagram illustrating an example of appearance frequencies of codewords to be mapped in a plurality of mapping rules.

Figure 1:
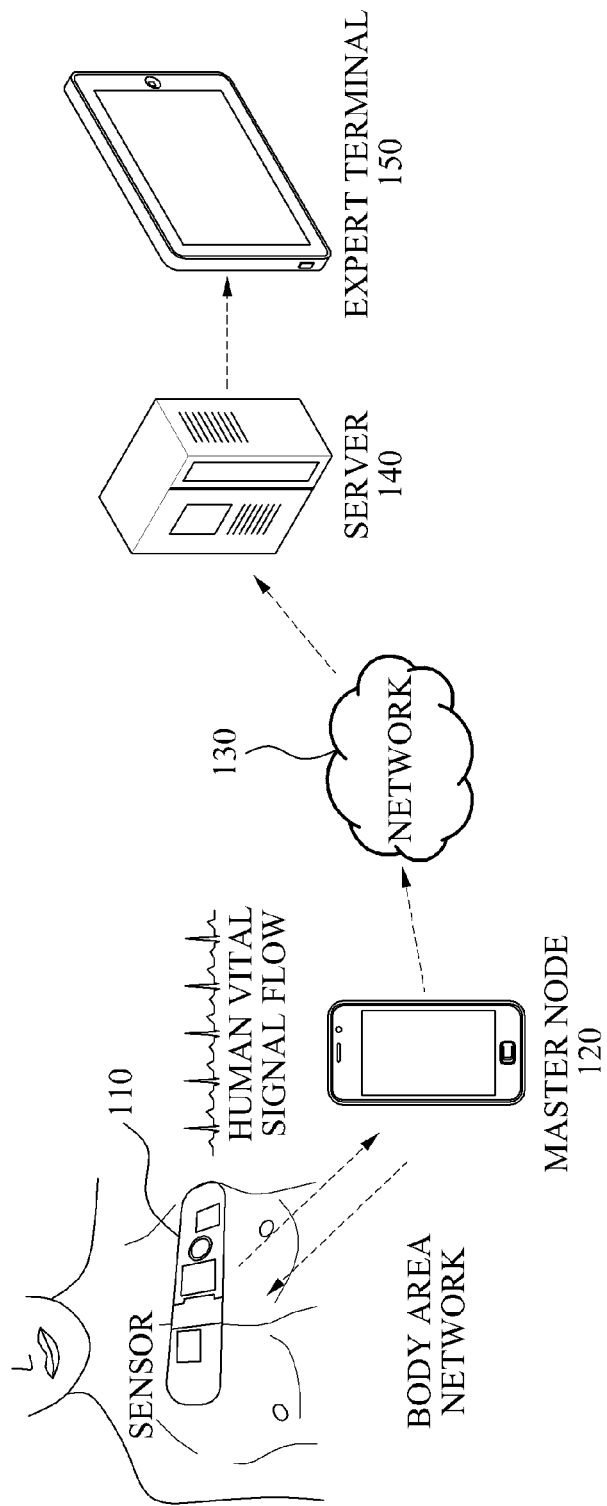
FIG. 1 is a diagram illustrating an example of a wireless communication network for collecting a biosignal.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates an example of a wireless communication network for collecting a biosignal.

Referring to FIG. 1, the wireless communication network may include a sensor 110, a master node 120, a network 130, a server 140, and an expert terminal 150.

The sensor 110 may sense a biosignal from a user such as a patient, for example, and transmit the sensed biosignal to the master node 120. Here, the master node 120 may refer to a mobile device, such as an access point, a gateway, a femtocell base station, a repeater, or a smart phone, for example. However, the master node 120 may be any computing device or terminal that is capable of receiving the sensed biosignal from the sensor 110.

In an aspect, the master node 120 provides a collected biosignal of a user to the server 140 via the network 130. In such an aspect, the server 140 serves as a storage repository for multiple collected biosignals from multiple users. The expert terminal 150 thus obtains access to biosignals of a plurality of users through connecting to the server 140.

The sensor 110 may require a low power consumption. The sensor 110 may use a minimum energy coding scheme to achieve the low power consumption. Greater details about the use of such a minimum energy coding scheme will now be provided with respect to the other figures.

FIG. 2 illustrates an example of a minimum energy coding scheme.

Referring to FIG. 2, in an embodiment, a source bitstream is partitioned into a plurality of groups. Here, the plurality of groups has a preset size, for example, k bits, and the size may be either fixed or adjusted adaptively.

According to the minimum energy coding scheme, a group of k bits are mapped to a codeword of n bits. In this instance, $k \leq n \leq 2^k - 1$. In particular, the minimum energy coding scheme is able to reduce a power consumption through minimizing or reducing a number of "1" included in a plurality of codewords to be mapped. Because a "1" signal generally requires more power to transmit than a "0" signal, because a "1" signal is generally represented by a high voltage and a "0" signal is generally represented by a low voltage, if the same information is transmitted by using a code where multiple "0" signals replace a smaller number of "1" signals, such a coding scheme may transmit more bits to transmit the same information, but actually use less energy in the process.

For example, a group "111" of three bits may be mapped to a codeword "1000000" of seven bits, and in such a process, a number of "1" included in the group of three bits may be reduced from three to one.

In an embodiment, the minimum energy coding scheme determines a mapping rule for the power consumption to be minimized through assessing an appearance frequency of the groups in the bitstream. For example, when the group "111" of three bits has a highest appearance frequency in the bitstream, the group "111" of three bits is mapped from "111" to "000". In a particular example, the minimum energy coding scheme determines a mapping rule that provides for a choice of codewords so that the number of "1" bits will be minimized when using the codewords to represent the source bit streams.

As will be discussed in greater depth later, in some situations the minimum energy coding scheme upsets a DC balancing. As an extreme example, when every bit included in a source bitstream is "1", every bit included in codewords that are mapped may be "0". In this extreme example, a power consumption decreases. However, in this approach a bad side effect may be applied to a DC balance, because the DC balance may only be maintained when codewords to be mapped include an appropriate number of "1" values.

Embodiments provide a method and apparatus for maintaining a DC balance through choosing codewords to be mapped including an appropriate number of "1" values.

FIG. 3 illustrates an example of appearance frequencies of codewords to be mapped in a plurality of mapping rules.

According to a mapping rule 1 shown in FIG. 3, $S_0$ appears most frequently, and $S_4$ appears least frequently. Here, according to the mapping rule 1, $S_0$ is mapped to $M_0$, and $S_4$ is mapped to $M_4$.

According to a mapping rule 2, $S_4$ appears most frequently, and $S_0$ appears least frequently. Here, according to the mapping rule 2, $S_0$ is mapped to $M_1$, and $S_4$ is mapped to $M_0$o.

According to a mapping rule 3, $S_2$ appears most frequently, and $S_3$ appears least frequently. Here, according to the mapping rule 3, $S_2$ is mapped to $M_0$, and $S_3$ is mapped to $M_2$.

As will be discussed later, the three mapping rules 1, 2, and 3 may require differing power consumptions because they map different groups to different codewords, and also result in differing outcomes from the viewpoint of a DC balance. Accordingly, embodiments need to ascertain a mapping rule that maintains a DC balance while also decreasing a power consumption by managing the number of "1" signals in the bitstream. When embodiments address both of these goals simultaneously, it becomes possible to manage power consumption without disturbing the DC balance of codewords in a way that interferes with bitstream transmission.

Figure 4:
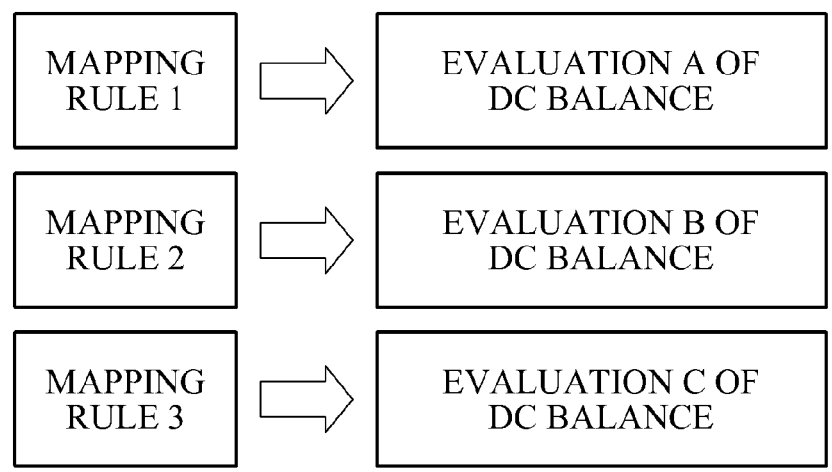
FIG. 4 is a diagram illustrating an example of direct current (DC) balances of codewords to be mapped in a plurality of mapping rules.

FIG. 4 illustrates an example of DC balances of codewords to be mapped in a plurality of mapping rules.

Referring to FIG. 4, the plurality of mapping rules may have differing DC balances as described above because a collection of codewords corresponding to the plurality of mapping rules includes differing numbers of "1" values.

In an aspect, a DC balance corresponding to a plurality of mapping rules is evaluated. The evaluation of the mapping rules are used to select which mapping rule to use. For example, a mapping rule that upsets a DC balance may not be selected while mapping rules that do not upset a DC balance may have precedence. As noted above, a goal of embodiments may be to minimize power consumption, but in an aspect, mapping rules that upset a DC balance may be avoided even if they minimize power consumption because a mapping rule that upsets a DC balance may lead to operational problems that outweigh any advantages of minimum power consumption In a particular embodiments, an evaluation of the DC balance corresponding to the plurality of mapping rules is predicted, and based on a result of the evaluation, an optimal mapping rule is determined. Optionally, such an embodiment may then implement the optimal mapping rule.

Figure 5:
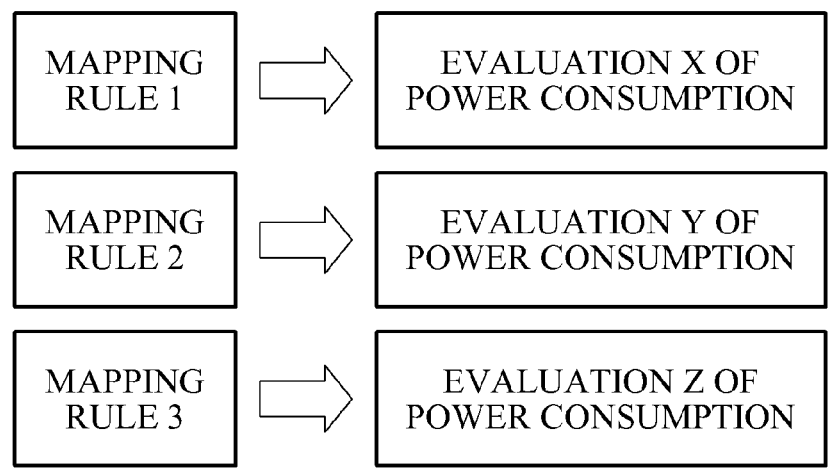
FIG. 5 is a diagram illustrating an example of a power consumption evaluations of codewords to be mapped in a plurality of mapping rules.

FIG. 5 illustrates an example of a power consumption evaluations of codewords to be mapped in a plurality of mapping rules.

As described above, the plurality of mapping rules may have differing power consumptions because a collection of codewords corresponding to the plurality of mapping rules includes differing numbers of "1" values.

In an embodiment, a power consumption corresponding to the plurality of mapping rules is evaluated. For example, an evaluation of the power consumption corresponding to the plurality of mapping rules is predicted, and based on a result of the evaluation, an optimal mapping rule is determined In an additional aspect, requirements or a solution for environmental conditions are provided by selectively applying a weighting to any one of the evaluations of the power consumption and the DC balance. For example, a weighting may be applied to the evaluation of the power consumption, rather than to the evaluation of the DC balance when reducing the power consumption is essential. Conversely, when maintaining a balance is vital, the weight may be applied to the evaluation of the DC balance rather than to the evaluation of the power consumption. For example, an evaluation may include a score or another metric that represents the power consumption, a score or another metric that represents the DC balance, or another factor that measures the desirability of a mapping rule. By using such scores or other metrics, an embodiment may be able to produce evaluations of mapping rules and rank the mapping rules.

Figure 6:
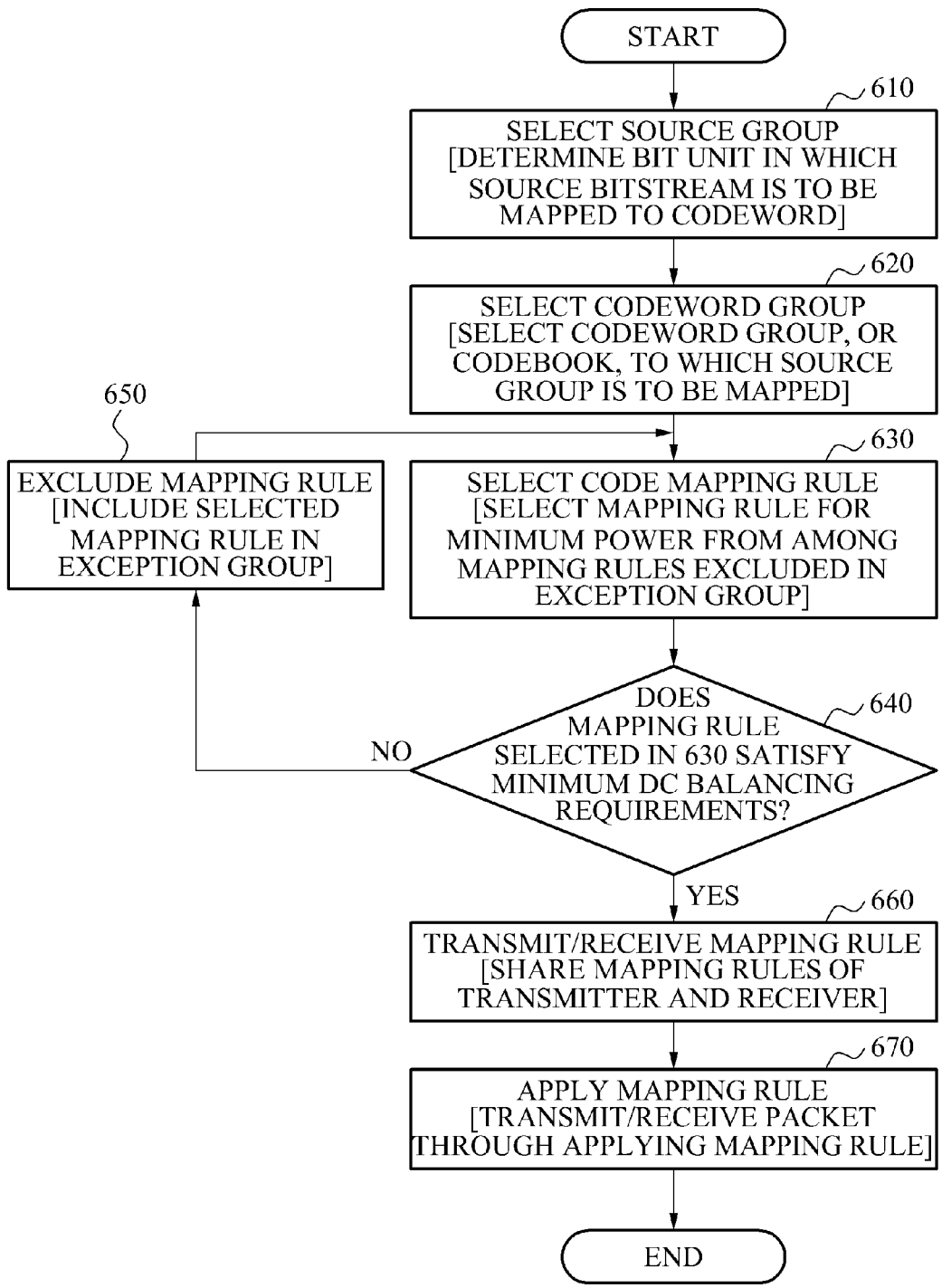
FIG. 6 is a flowchart illustrating an example of a minimum energy coding method through assessing a DC balance.

FIG. 6 is a flowchart illustrating an example of a minimum energy coding method through assessing a DC balance.

In 610, in an embodiment, a plurality of groups are selected through partitioning a source bitstream into groups of a preset size of k bits prior to applying minimum energy coding while also assessing a DC balance. The plurality of groups may be represented by a combination of a bit pattern because the bit pattern that may be represented by k bit may be a total of $2^k$. For example, when k is two, the plurality of groups may be represented by a combination of "00, 01, 10, 11 patterns".

A value k is determined for a power consumption to be minimized subsequent to the minimum coding being applied in 610 because an efficiency of minimum energy coding is determined based on the value k to be set. The value k may need to be determined for a predetermined bit pattern associated with a certain appearance frequency because a basic concept of the minimum energy coding is to map a most frequently appearing bit pattern to a codeword having a great number of zeros. Accordingly, in 610 in an aspect, the value k is selected based a greatest difference value of an appearance frequency of a number of $2^k$ bit patterns through changing the value k. In an example, a difference of an appearance frequency between a most frequently appearing pattern and a second most frequently appearing pattern, or dispersion values of all appearance frequencies is used as an index.

In 620, in an embodiment, a codeword group to which a plurality of groups obtained from a source bitstream is mapped is selected by the minimum energy coding method while also assessing the DC balance. In 620, the codeword group searches for a value n minimizing a power consumption because a codeword group is automatically determined to include $2^n$ codewords when a codeword length value n is determined In this instance, the value n is greater than the source bit pattern k and less than $2^k-1$ because when the value n is less than k, a mapping rule will not operate properly due to a number of codewords being less than a number of source bit patterns, and when the value n is greater than $2^k-1$, a number of transmitted "1" values may not be reduced. Accordingly, in 620, the value n at which the power consumption becomes minimized when a code group is selected by changing the value n to an appropriate value from k to $2^k-1$. Based on this appropriate value n, the plurality of groups are mapped to a codewords such that the number of transmitted "1" values is minimized In such an embodiment, a power consumption of a power amplifier is decreased through reducing a duration of time to turn on the power amplifier of a radio frequency (RF) transmitter because the greater the value n, the fewer the number of transmitted "1" values are necessary. However, other considerations affect power management. For example, additional power may be consumed as a duration of time to turn on a block aside from the power amplifier increases because a duration of time to transmit a single source bit pattern may be longer if additional bits are included in a bitstream. Accordingly, in 620, an optimal value n may be determined based on a ratio that considers a decrease in the number of transmitted "1" values in comparison to an increase of the power consumed by the power amplifier, the power consumed by the block aside from the power amplifier, and an increase of the value n.

In an existing wireless communication system, the power consumed by the block aside from the power amplifier may be insignificant because the power consumed by the block aside from the power amplifier is less than the power consumed by the power amplifier. However, in a local low power wireless communication system, an optimal codeword group may be determined through assessing the power consumed by the power amplifier and the power consumed by the block aside from the power amplifier, as the power consumed by the block aside from the power amplifier is not necessarily insignificant, and considering the power aside from the power amplifier improves the accuracy of power consumption estimation, which results in better overall power management.

In 630, in an embodiment, an optimal mapping rule between a source bit pattern and a codeword is selected. The codeword is mapped to the source bit pattern chosen for an average number of "1" values to be transmitted to be minimized Here, a mapping rule included in an exception group may be excluded because such a mapping rule does not satisfy a DC balance consideration.

In this instance, the determining 630 of the optimal mapping rule includes determining the optimal mapping rule through reordering, such as sequentially or recursively, codewords to be mapped that correspond to the plurality of groups. In an example, referring to FIG. 3, the determining 630 of the optimal mapping rule includes determining the optimal mapping rule through mapping the plurality of groups to respective codewords sequentially or recursively based on the mapping rules 1, 2, and 3.

In an embodiment, the determining 630 of the optimal mapping rule includes selecting the optimal mapping rule from at least one of a plurality of mapping rules available through assessing a DC balance of the codewords to be mapped.

In an embodiment, the determining 630 of the optimal mapping rule includes changing a first mapping rule determined to be the optimal mapping rule in a first time interval to a second mapping rule to be distinguished from the first mapping rule in a second time interval. In particular, a mapping rule may be changed real time or periodically. By changing the mapping rule in this matter, if the contents of the bitstream change or the configuration of an apparatus otherwise changes, it becomes possible to adapt to those changes.

In this embodiment, the determining 630 of the optimal mapping rule includes predicting a frequency of the codewords to be mapped, and calculating a DC balance associated with the codewords to be mapped based on the predicted frequency.

The determining 630 of the optimal mapping rule includes the predicting of the frequency of the codewords to be mapped because, for example, when long strings of the value "0", such as "000 . . . 000" among the codewords to be mapped appear frequently, the DC balance may be upset.

Also, in an example, in 640, whether minimum requirements for DC balancing are satisfied are verified when the source bitstream is transmitted to the mapping rule selected in 630. When an embodiment verifies that the DC balancing does not satisfy the minimum requirements for DC balancing, a corresponding mapping rule may be included in the exception group in 650, and continue performing the process in 630. In an example, whether a number of "0" to be transmitted continuously subsequent to a plurality of groups being mapped to a codeword is less than a predetermined threshold value is used as the minimum requirements for the DC balancing.

In 660, in an embodiment, the minimum energy coding method that considers the DC balance generates an indicator for indicating an optimal mapping rule that was determined The indicator may be transmitted to a master node as discussed above, and transmitted along with mapped codewords or individually.

In 670, in an embodiment, the minimum energy coding method through assessing the DC balance map the plurality of groups to the codewords determined by the determined optimal mapping rule, using a minimum energy coding scheme.

The mapped codewords may be transmitted to the master node for further processing and utilization.

The processes, functions, methods and/or software described above including a minimum energy coding method through assessing a DC balance may be recorded, stored, or fixed in one or more non-transitory computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above, or vice versa. In addition, a non-transitory computer-readable storage medium may be distributed among computer systems connected through a network and non-transitory computer-readable codes or program instructions may be stored and executed in a decentralized manner.

Figure 7:
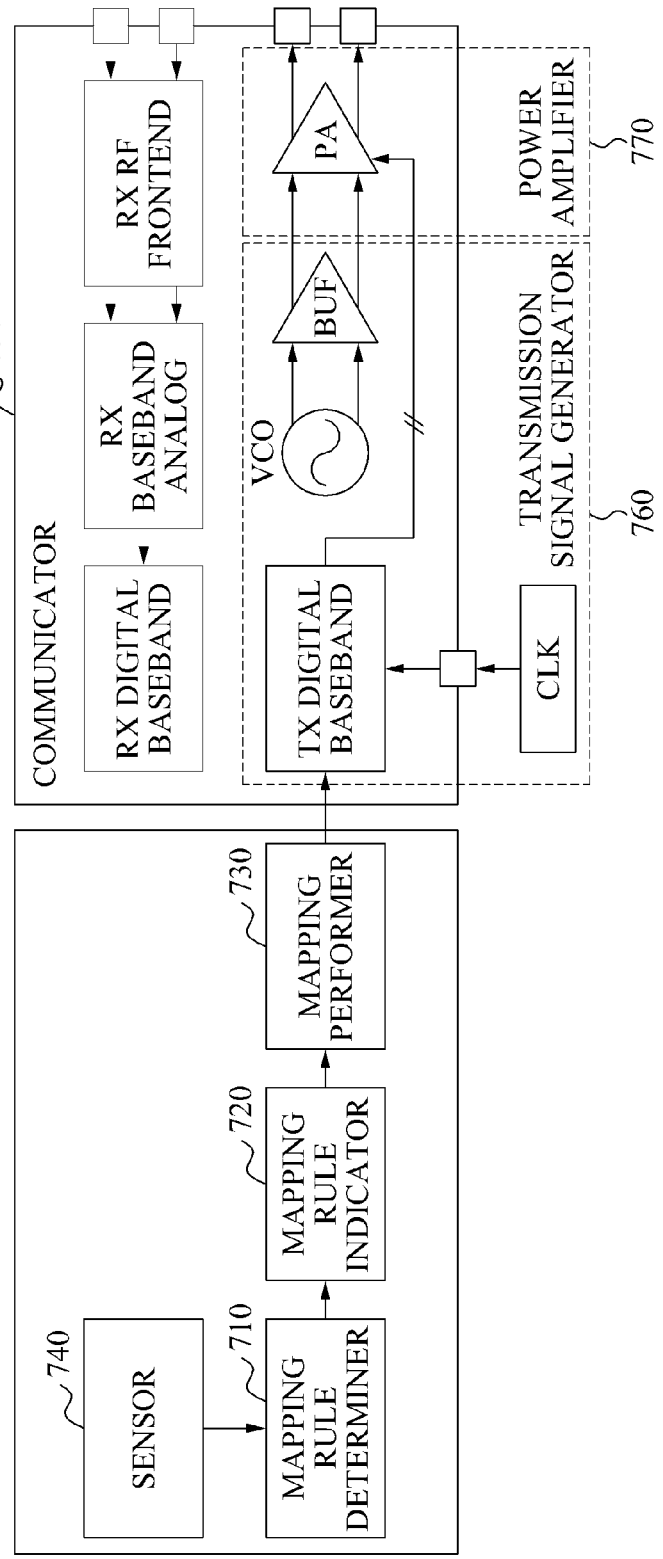
FIG. 7 is a block diagram illustrating an example of a minimum energy coding apparatus that assesses a DC balance.

FIG. 7 illustrates an example of a minimum energy coding apparatus that assesses a DC balance.

Referring to FIG. 7, in an embodiment the minimum energy coding apparatus includes a mapping rule determiner 710, a mapping rule indicator generator 720, a mapping performer 730, a sensor 740, and a communicator 750. The communicator 750 may be configured to include a transmission signal generator 760 and a power amplifier 770.

The mapping rule determiner 710 determines an optimal mapping rule between a plurality of groups of bits obtained from a source bitstream and a plurality of mapped codewords through assessing a DC balance of the mapped codewords, as discussed above.

The mapping rule indicator generator 720 generates an indicator for indicating the optimal mapping rule.

The mapping performer 730 maps the plurality of groups to the codewords determined by the determined optimal mapping rule, using the minimum energy coding scheme. In an embodiment, the optimal mapping rule optimizes a power consumed by the transmission signal generator 760 and the power amplifier 770.

In an embodiment, the sensor 740 senses a biosignal, and generates a source bitstream corresponding to the biosignal. The communicator 750 transmits the mapped codewords and an indicator to a master node.

In various embodiments, the mapping rule determiner 710 determines the optimal mapping rule through reordering, such as sequentially or recursively, the mapped codewords corresponding to the plurality of groups.

The mapping rule determiner 710 selects at least one of mapping rules available to be the optimal mapping rule while considering power consumption as well as a DC balance of the mapped codewords.

The mapping rule determiner 710 may change a first mapping rule determined to be the optimal mapping rule in a first time interval to be a second mapping rule distinguished from the first mapping rule in a second time interval. For example, the mapping rule determiner 710 may change from the first mapping rule to the second mapping rule in situations where there are changes in the contents of the source bitstream that affect power consumption or DC balance.

Figure 8:
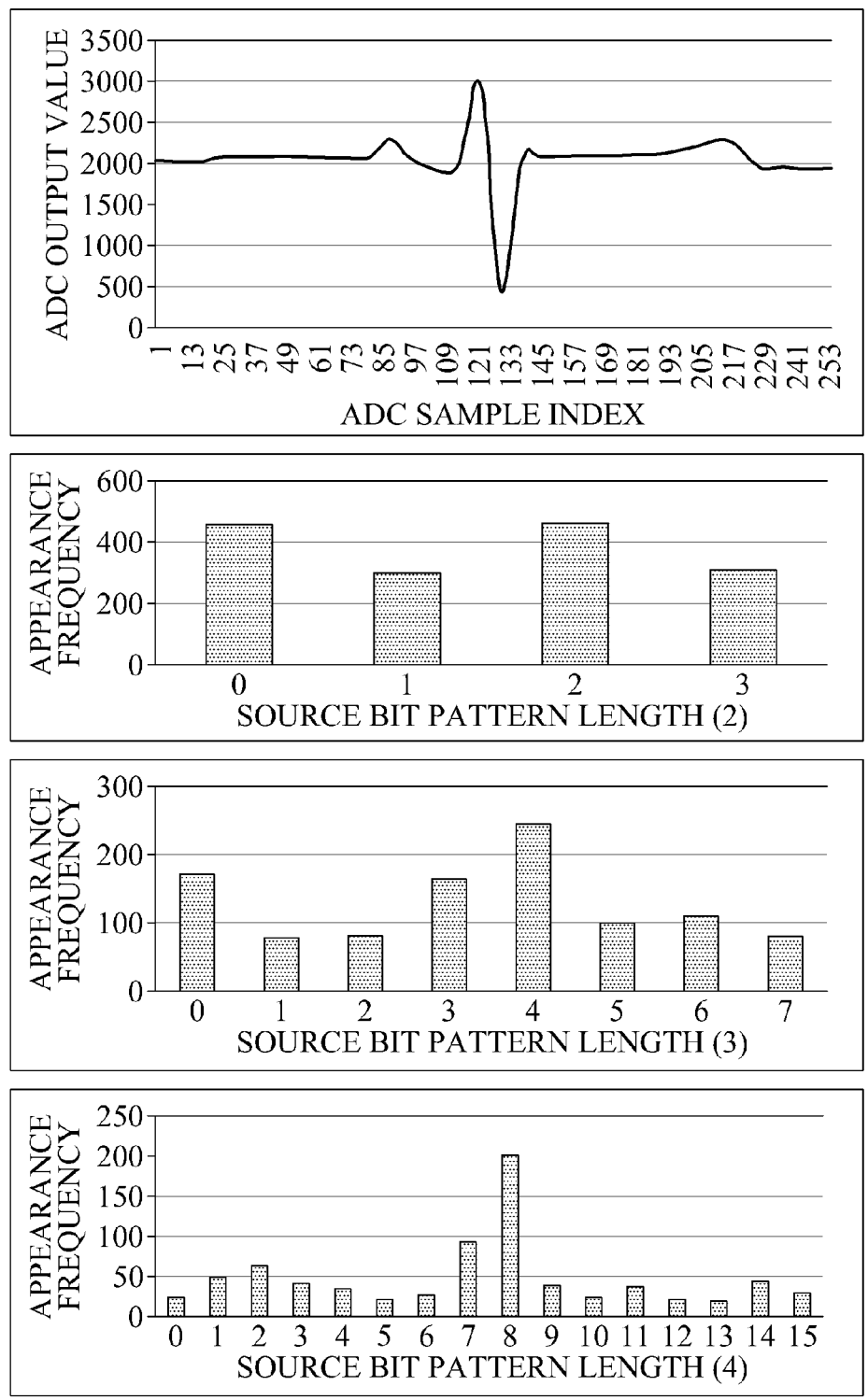
FIG. 8 is a set of graphs illustrating examples of a process of selecting a source group.

FIG. 8 is a set of graphs illustrating an example of selecting 610 a source group, and illustrates an actual appearance frequency that occurs when changing a length of a source bit pattern of a body electrocardiogam (ECG) record waveform to 2, 3, and 4 bit pattern lengths. When the length of the source bit pattern is selected to be "4", an efficiency of the minimum energy coding increases because a frequency difference of the source bit pattern "4" is greater than a frequency difference of the source bit patterns 2 and 3.

In the example of FIG. 8, a duration of time spent in searching for an optimal bit pattern is reduced, using measures of an analog-to-digital (ADC) output resolution bit of a sensor as a candidate for a length of a source bit pattern.

Figure 9:
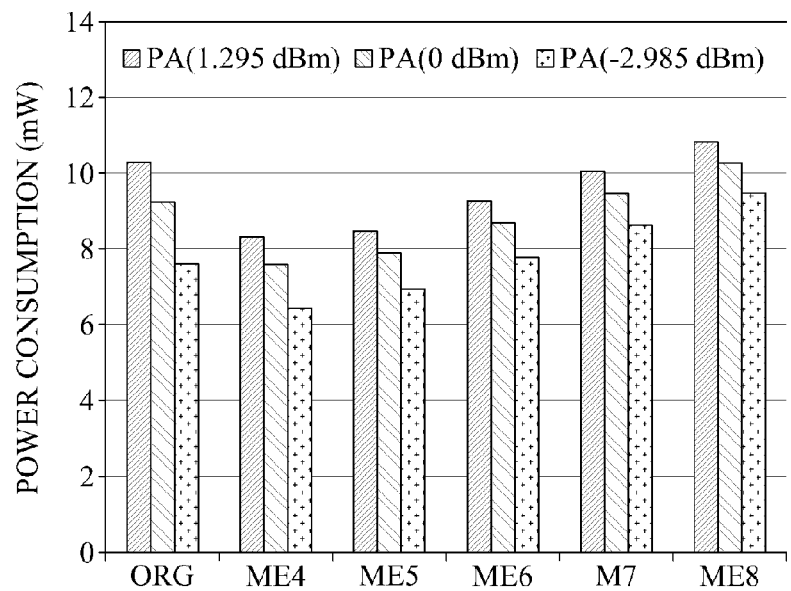
FIG. 9 is a diagram illustrating an example of a process of selecting a codeword group.

FIG. 9 is a diagram illustrating an example of a process of selecting 620 a codeword group. Using the source pattern length 4 selected in FIG. 8, a bitstream to transmit may be aligned based on an appearance frequency of a source pattern. When a length of a codeword changes from 4 (ME4) to 8 (ME8), the codeword is selected to minimize a number of "1" values to be transmitted. The number of "1" values to be transmitted may decrease as the length of the codeword increases, because longer codewords have more space for padding the code words with "0" values. However, in some examples transmitting more values leads to a longer duration of time spent for transmitting.

Accordingly, in an embodiment, as the length of the codeword increases, a power consumed by the transmission signal generator 760 of FIG. 7 increases, and a power consumed by the power amplifier 770 decreases. Here, a power consumed by a communicator when minimum energy coding is applied for a plurality of lengths of codewords may be calculated, using the power consumption of the transmission signal generator and the power consumption of the power amplifier. Subsequently, the length of the codeword at which the power consumption becomes minimized may be selected to be the optimal length of the codeword. Various techniques and methods may be used to minimize power consumption. For example, these techniques may include iterative techniques or heuristics.

Figure 10:
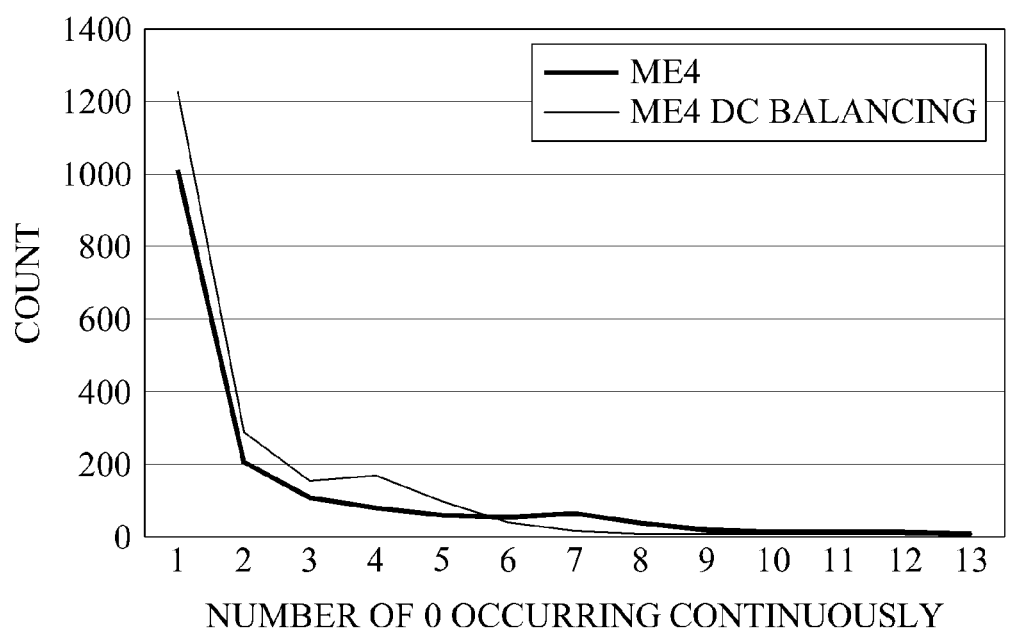
FIG. 10 is a graph illustrating an example of a degree to which DC balancing is enhanced.

FIG. 10 is a graph illustrating an example of a degree to which DC balancing is enhanced when verifying 640 requirements for DC balancing, excluding 650 a mapping rule, and reselecting 630 a mapping rule are performed continuously. In this instance, a greatest value for "0" to be transmitted continuously is used for enforcing requirements for DC balancing. The DC balancing may be enhanced through reducing the greatest value for "0" to be transmitted continuously by applying the provided method. A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The examples of a method and an apparatus provided above may improve power consumption in a body area network or a low power network while preserving DC balancing.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

As a non-exhaustive illustration only, a terminal/device/unit described herein may be a mobile device, such as a cellular phone, a personal digital assistant (PDA), a digital camera, a portable game console, an MP3 player, a portable/personal multimedia player (PMP), a handheld e-book, a portable laptop PC, a global positioning system (GPS) navigation device, a tablet, a sensor, or a stationary device, such as a desktop PC, a high-definition television (HDTV), a DVD player, a Blue-ray player, a set-top box, a home appliance, or any other device known to one of ordinary skill in the art that is capable of wireless communication and/or network communication.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for performing minimum energy coding, comprising:
    obtaining groups of bits from a source bitstream;
    determining a mapping rule corresponding to a minimum energy coding scheme between the groups of bits and corresponding codewords to maintain a direct current (DC) balance of the codewords to be mapped by reordering the codewords to be mapped; and
    mapping the groups of bits to the codewords determined by the mapping rule.

2. The method of claim 1, wherein the determining of the mapping rule comprises:
    determining the mapping rule by reordering the codewords to be mapped, sequentially or recursively.

3. The method of claim 1, further comprising:
    minimizing the transmission energy required to transmit the groups of bits while maintaining the DC balance of the codewords to be mapped through the mapping rule.

4. The method of claim 1, wherein the determining of the mapping rule comprises:
    selecting from mapping rules a mapping rule that maintains the DC balance of the codewords to be mapped as an optimal mapping rule.

5. The method of claim 1, wherein the determining of the mapping rule comprises:
    changing the mapping rule from a first mapping rule determined to be the mapping rule in a first time interval to a second mapping rule distinguished from the first mapping rule in a second time interval.

6. The method of claim 1, wherein the determining of the mapping rule comprises:
    predicting frequencies of groups of bits in the source bitstream corresponding to the codewords to be mapped; and
    calculating a DC balance corresponding to the codewords to be mapped, based on the predicted frequencies.

7. The method of claim 1, wherein the obtaining of the groups of bits from the source bitstream comprises:
    obtaining groups of bits from the source bitstream, each group of bits comprising a predetermined size.

8. The method of claim 1, further comprising:
    generating an indicator for indicating the mapping rule; and
    transmitting the indicator to a master node.

9. The method of claim 1, further comprising:
    sensing a biosignal, using a sensor, the biosignal corresponding to the source bitstream; and
    transmitting the mapped codewords to a master node.

10. A non-transitory computer-readable medium comprising a program for instructing a computer to perform the method of claim 1.

11. An apparatus for performing minimum energy coding, comprising:
    a mapping rule determiner configured to determine a mapping rule corresponding to a minimum energy coding scheme between groups of bits obtained from a source bitstream and corresponding codewords to maintain a direct current (DC) balance of the codewords to be mapped by reordering the codewords to be mapped; and
    a mapping unit configured to map the groups of bits to the codewords determined by the mapping rule.

12. The apparatus of claim 11, wherein the mapping rule determiner is configured to determine the mapping rule by reordering the codewords to be mapped, sequentially or recursively.

13. The apparatus of claim 11, wherein the mapping rule determiner minimizes the transmission energy required to transmit the groups of bits while maintaining the DC balance of the codewords to be mapped.

14. The apparatus of claim 11, wherein the mapping rule determiner is configured to select from mapping rules a mapping rule that maintains the DC balance of the codewords to be mapped as an optimal mapping rule.

15. The apparatus of claim 11, wherein the mapping rule determiner is configured to change a first mapping rule determined to be the mapping rule in a first time interval to a second mapping rule distinguished from the first mapping rule in a second time interval.

16. The apparatus of claim 11, further comprising:
    a sensor configured to sense a biosignal and generate a source bitstream corresponding to the biosignal.

17. The apparatus of claim 11, further comprising:;
    a mapping rule indicator generator configured to generate an indicator for indicating the mapping rule; and
    a communicator configured to transmit the indicator and the mapped codewords to a master node.

18. An apparatus for performing minimum energy coding while maintaining a direct current (DC) balance, comprising:
    a sensor configured to receive a biosignal, the biosignal corresponding to a bitstream; and
    a mapping rule determiner configured to:
        obtain groups of bits from the bitstream; and
        determine an optimal mapping rule corresponding to an energy coding scheme for the groups of bits by reordering the codewords to be mapped until the codeword ordering minimizes the transmission energy required to transmit the groups of bits while maintaining a DC balance of the codewords to be mapped.

19. The apparatus of claim 18, further comprising:
    a mapping rule indicator generator configured to generate an indicator for indicating the optimal mapping rule; and
    a communicator configured to transmit the indicator and the mapped codewords to a master node.

20. The apparatus of claim 18, wherein the mapping rule determiner determines the optimal mapping rule by reordering the codewords to be mapped, sequentially or recursively, until the codeword ordering minimizes the transmission energy required to transmit the groups of bits while maintaining a DC balance of the codewords to be mapped.

* * * * *